(12) United States Patent
Davis

(10) Patent No.: US 7,611,366 B2
(45) Date of Patent: Nov. 3, 2009

(54) METER SOCKET BYPASS DISCONNECT DEVICE

(75) Inventor: Danny J. Davis, Moundville, AL (US)

(73) Assignee: The Southern Company, Atlanta, GA (US)

( * ) Notice: Subject to any disclaimer, the term of this patent is extended or adjusted under 35 U.S.C. 154(b) by 398 days.

(21) Appl. No.: 11/601,257

(22) Filed: Nov. 17, 2006

(65) Prior Publication Data

US 2007/0117436 A1 May 24, 2007

Related U.S. Application Data

(60) Provisional application No. 60/738,691, filed on Nov. 21, 2005.

(51) Int. Cl.
*H01R 29/00* (2006.01)

(52) U.S. Cl. ........................... 439/188; 361/633

(58) Field of Classification Search ............... 439/188, 439/508, 517; 361/633
See application file for complete search history.

(56) References Cited

U.S. PATENT DOCUMENTS

| | | | |
|---|---|---|---|
| 3,643,209 A | 2/1972 | Coston | |
| 5,088,004 A * | 2/1992 | Howell | 361/669 |
| 5,097,383 A | 3/1992 | Heard et al. | |
| 5,283,572 A * | 2/1994 | McClelland et al. | 340/870.02 |
| 5,620,337 A | 4/1997 | Pruehs | |
| 5,668,533 A * | 9/1997 | Jackson et al. | 340/547 |
| 5,756,935 A | 5/1998 | Balanovsky et al. | |
| 6,015,314 A | 1/2000 | Benfante | |
| 6,520,798 B1 | 2/2003 | Robinson et al. | |
| 6,846,199 B1 * | 1/2005 | Robinson et al. | 439/517 |
| 2003/0043516 A1 * | 3/2003 | Ahlstrom et al. | 361/48 |

* cited by examiner

*Primary Examiner*—Tho D Ta
*Assistant Examiner*—Travis Chambers
(74) *Attorney, Agent, or Firm*—Seyed Kaveh E. Rashidi-Yazd, Esq.; Ryan A. Schneider, Esq.; Troutman Sanders LLP

(57) ABSTRACT

A meter socket bypass disconnect device for disconnecting service using a bypass meter socket. The meter socket bypass disconnect device includes a housing, a disconnect system for interfacing with a meter socket, an indication system for indicating power phase and load status, and a switching system for moving the meter socket bypass disconnect device between an open load position and a closed load position. The disconnect system is further adapted to make load and break load on a bypass meter socket without the use of the meter bypass lever. The disconnect system, indication system, and switching system are containable or partially containable within the housing.

10 Claims, 9 Drawing Sheets

METER SOCKET BYPASS DISCONNECT DEVICE

CROSS REFERENCE TO RELATED APPLICATION

This application claims benefit, under 35 U.S.C. § 119(e), of U.S. Provisional Application Ser. No. 60/738,691, filed 21 Nov. 2005, the entire contents and substance of which are hereby incorporated by reference.

TECHNICAL FIELD

The present invention relates generally to a meter socket bypass disconnect device for disconnecting electrical service using a bypass meter base, and in particular to a meter socket bypass disconnect device that may be used as a load make and/or load break operation device.

BACKGROUND OF THE INVENTION

Electric meters, such as watt-hour meters, are commonly used in the electric utility industry. The electric meters are generally utilized to measure the amount of electrical power used at a residential or commercial building location. To secure the electric meter, a meter box or cabinet is generally mounted outside the building, such as on one of the sidewalls of the building. The meter box often contains a meter socket in which the electric meter plugs into during use. The meter socket comprises line terminals that connect to the electric power line conductors extending from the utility power source and load terminals that connect to the residential or commercial building consuming the incoming line power.

The line and load terminals of the meter socket are designed to receive the blade terminals extending outward from the base of the electric meter. Once plugged into the meter socket, the electric meter completes an electric circuit between the line and load terminals of the meter socket. As electricity is transferred from the line terminals to the load terminals (e.g., from the utility line power source to the building) the electric meter measures the amount of electricity provided.

Occasionally, the electric meter will need to be removed for service. For example, one of the terminals or contacts within the electric meter may burn out, thereby reducing the amount of electricity provided to the building. Additionally, the electric meter may malfunction, such that the electric meter does not measure the correct amount of electricity that is utilized by the residential or commercial building.

Removal of an electric meter for repair typically requires a temporary outage of electricity to the building associated with the removed electric meter. To prevent such an inconvenience to businesses and some residences, utility companies install improved meter sockets having a meter bypass, which allows the electric current to bypass the electric meter and flow directly from the utility line power source to the residential or commercial building. During bypass, the electric meter may be removed from the meter socket without interrupting service to the customer. Of course, when the electric meter has been removed, the customer is not being charged for the consumption of electricity.

Additionally, the bypass meter socket may be used to perform a service disconnect for non-pay (e.g., discontinuing electric service because the customer has not paid for past services). In such a situation, the bypass meter socket may prevent electric current flow between the line terminals and the load terminals and, therefore, prevent electricity from reaching the corresponding building of the delinquent customer.

Typically, when disconnect of electrical service to a particular site or building is desired, a utility service person is dispatched to the particular building and removes the electric meter. To reconnect the electrical service, another service person must be sent out to reinstall the electric meter. Such a sequence is labor intensive and, therefore, expensive.

Current bypass meter sockets, however, are not designed to handle load breaking and load making. Generally, load breaking refers to the ability of the switching device to interrupt a load current without damage, while load making refers to the ability of the switching device to connect to a specific load current without damage. Manufacturers of most bypass meter sockets have attached warning labels indicating that the bypass meter socket is not intended to be used as a load make or load break operational device. Accordingly, the bypass handle should not be moved without an electric meter properly installed into the bypass meter socket. Without an electric meter properly installed, the bypass meter socket may create a deadly arc of electricity if the bypass handle is moved, such that a load make or load break is applied to the bypass meter socket.

Further, manufacturers have attached an additional warning label prohibiting the use of disconnect sleeves (also referred to as "boots") in the bypass meter socket. Disconnect sleeves are generally placed over the meter blade terminals on the second aspect of the meter and, when placed in the meter socket, prevent current from flowing through the meter. Such a use of disconnect sleeves may be used to disconnect service to a customer for nonpayment. The disconnect sleeves, however, tend to get lodged in the bypass meter socket and tear, thus requiring the use of a special tool for removal. The damaged disconnect sleeves may lead to malfunctions in the bypass meter socket. Without the use of disconnect sleeves, the electric meter must be completely removed from the meter socket to discontinue service.

The alternatives to perform a proper disconnect of service where a bypass meter socket is involved include operating the customer's main breaker to remove the customer load, operating a line side disconnect device connected ahead of the meter (if one has already been installed), disconnecting at the weather head, and disconnecting at the transformer serving the customer. Unfortunately, a service person does not always have access to the customer's main breaker, especially in cases where the disconnect is due to nonpayment of services. The other alternatives require labor intensive procedures to properly perform and, therefore, are very expensive.

Various devices have been developed to assist in meter repair and/or maintenance, including those devices disclosed in U.S. Pat. No. 3,643,209 to Coston, U.S. Pat. No. 5,097,383 to Heard et al., U.S. Pat. No. 5,620,337 to Pruehs, and U.S. Pat. No. 6,015,314 to Benfante. While fulfilling their intended purposes, the disclosed devices are not intended to be used for disconnecting services or are not designed for use with a bypass meter socket.

U.S. Pat. Nos. 6,520,798 and 6,846,199, both to Robinson et al., disclose a watt-hour meter socket adapter that may be used to disconnect a bypass meter socket. The watt-hour meter socket adapter utilizes a three-phase circuit breaker, a release mechanism, and a trigger handle used to release the adapter from the latching jaws of the bypass device. While appropriate for its intended purpose, the watt-hour meter socket adapter does not provide indication as to whether the adapter is currently in load make or load break operation. Further, the watt-hour meter socket adapter does not provide an indication as to whether the electricity is single phase or three phase. The disclosed watt-hour meter socket adapter uses a release handle to lock the adapter into place when attached to the bypass meter socket. The jaws of the adapter lock down on the meter terminal or the meter stabs, thereby making the adapter difficult to remove.

What is needed is a meter socket bypass disconnect device for disconnecting service using a bypass meter socket, which may provide load making and load breaking while a meter is removed from the bypass meter socket. Further, what is needed is a meter socket bypass disconnect device that may use disconnect sleeves so that the original meter may remain in the bypass meter socket, while discontinuing service to a particular building. It is to such a device that the present invention is primarily directed.

BRIEF SUMMARY OF THE INVENTION

Briefly described, in an exemplary embodiment according to the present invention, a meter socket bypass disconnect device is provided for disconnecting service using a bypass meter socket. The meter socket bypass disconnect device includes a housing, a disconnect system for interfacing with a meter socket, an indication system for indicating power phase and load status, and a switching system for moving the meter socket bypass disconnect device between an open load position and a closed load position. The disconnect system is further adapted to make load and break load on a bypass meter socket without the use of the meter bypass lever. The disconnect system, indication system, and switching system are containable or partially containable within the housing.

The housing generally includes a base and a cover, such that various components of the disconnect system, indication system, and switching system are positioned on the first aspect of the base and below the cover, while other various components are positioned on the first aspect of the cover. Indicators may be positioned along a peripheral wall of the cover, wherein the indicators provide, for example, instructions on how to use the meter socket bypass disconnect device to disconnect service using a bypass meter socket.

The disconnect system includes line side (or line) terminals and load side (or load) terminals that engage the corresponding line terminals and load terminals of the bypass meter socket. Accordingly, the line side terminals and load side terminals of the disconnect system are positioned on the first aspect of the base, but extend outwardly from the second aspect of the base in order to properly communicate with the bypass meter socket. The base, therefore, is formed to define several apertures in which the line side terminals and load side terminals extend from the first aspect of the base to the second aspect of the base.

Further, the disconnect system includes a latching relay adapted to move between a load make position and a load break position, thereby making load and breaking load on the bypass meter socket when the meter socket bypass disconnect device is connected to the bypass meter socket. The latching relay generally has first terminals, second terminals, a coil, and a connector. The first terminals are in communication with the line side terminals via a plurality of fuses and the second terminals are in communication with the load side terminals.

When the latching relay is in the closed position, an electric current may flow from the line side terminals to the first terminals, through the latching relay to the lower side terminals, and to the load side terminals where the electricity is provided to the customer for use. When the latching relay is in the open position, however, an electric current cannot flow between the first terminals and the second terminals and, therefore, cannot flow between the line side terminals and the load side terminals.

The latching relay further includes a first color wire, second color wire, and third color wire, such that in operation the first color wire and the third color wire activate the latching relay to the closed position and the operation of the second color wire and the third color wire activate the latching relay to the open position. The first color wire, second color wire, and third color wire are in communication with and receive signals from the switching system.

In an exemplary application according to the present invention, an indication system comprises a voltage distinguishing relay, and three sets of light indicators of different colors, $color^1$, $color^2$, and $color^3$ (e.g., amber, green, and red). The voltage distinguishing relay is in communication with the line side terminals and the set of $color^1$ light indicators. If the voltage distinguishing relay determines that the electric current is single phase, then the voltage distinguishing relay activates two of the color1 light indicators, whereby the two $color^1$ light indicators are illuminated. If the voltage distinguishing relay determines that the electric current is three phase, then the voltage distinguishing relay actives three of the $color^1$ light indicators, whereby the three $color^1$ light indicators are illuminated. Accordingly, the set of $color^1$ light indicators may include a plurality of separate light emitting diodes positioned on the housing.

The switching system includes a switch in communication with the first color wire, third color wire, and second color wire of the latching relay. The switch is adapted to activate the first color and third color wires or the second color and third color wires and, therefore, is adapted to move the latching relay between a load closed position and a load open position. When the switch is in a first position, the latching relay is in the closed position and the $color^3$ light indicator is illuminated. When the switch is in a second position, the latching relay is in the open position and the $color^2$ light indicator is illuminated.

The present invention offers visible indicators as to the type of service the device is being used for (i.e., single phase or three phase), and indicates the status of the device as to load closed or load open with $color^3$ and $color^2$ visuals, respectively. It is anticipated that the present invention will be a lower cost alternative than other circuit breaker designs currently on the market.

A principle object of the present invention is to provide a meter socket bypass disconnect device for disconnecting service to a customer using a bypass meter socket.

Another object of the present invention is to provide a meter socket bypass disconnect device that may be installed on a traditional bypass meter socket and may work with single phase and three phase electricity.

Still another object of the present invention is to provide a meter socket bypass disconnect device having an open position and a closed position, where the bypass meter socket is making load when the meter socket bypass disconnect device is in the closed position and where the bypass meter socket is breaking load when the meter socket bypass disconnect device is in the open position.

It is another object of the present invention to provide a disconnect system adapted to engage a bypass meter socket, wherein the disconnect system includes a latching relay that may be activated to a load open position and a load closed position.

Yet another object of the present invention is to provide an indication system adapted to indicate whether the electric current is single phase or three phase and whether the meter socket bypass disconnect device is making load or breaking load using the bypass meter socket.

Another object of the present invention is to provide a switching system adapted to move the latching relay between the load open position and the load closed position, such that a load make or load break is applied to the bypass meter socket without causing a deadly arc within the bypass meter socket.

These and other objects, features and advantages of the present invention will become more apparent upon reading the following specification in conjunction with the accompanying drawings.

DETAILED DESCRIPTION

Figure 1:
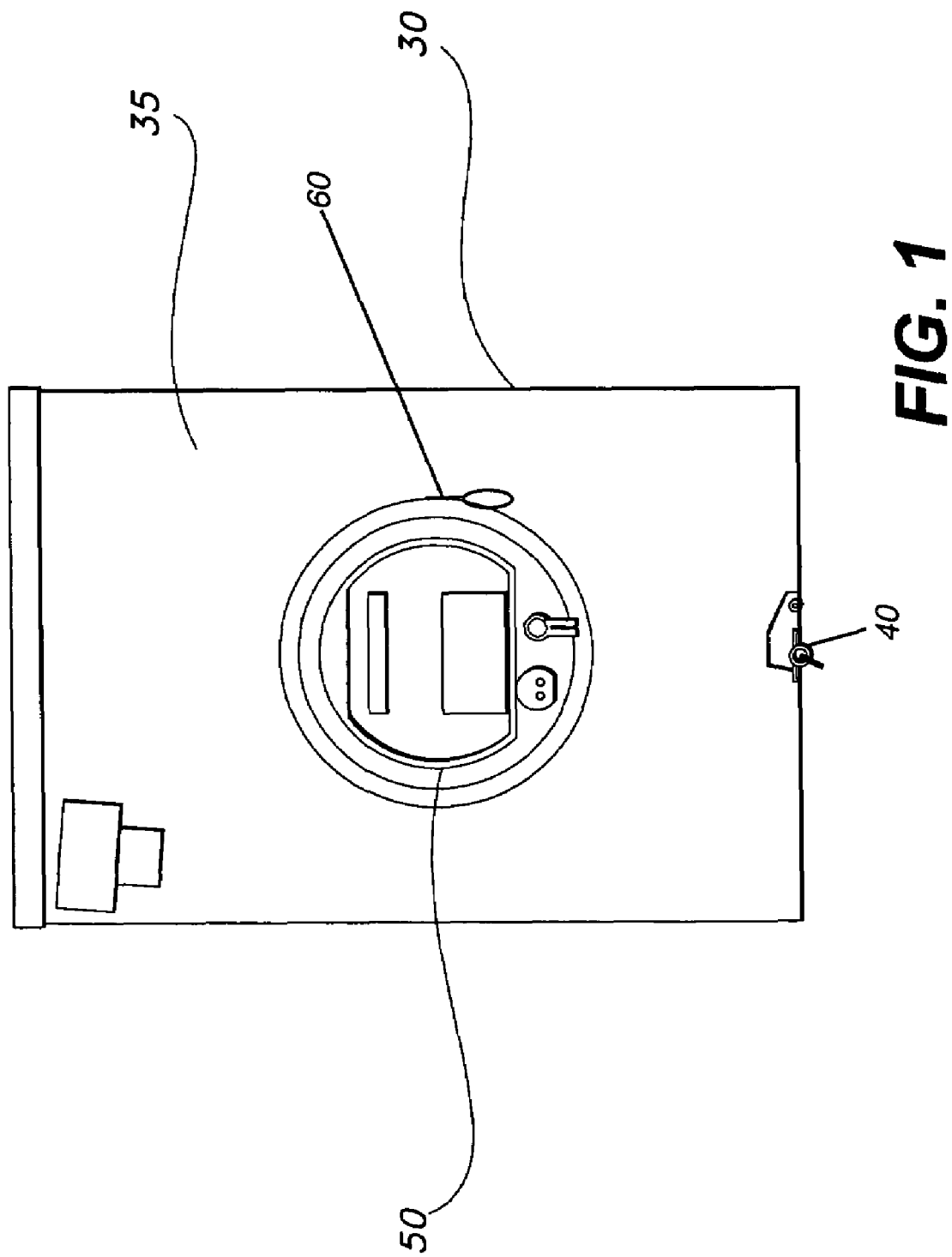
FIG. 1 illustrates a perspective view of a traditional electric meter with a corresponding meter socket box.
Figure 2:
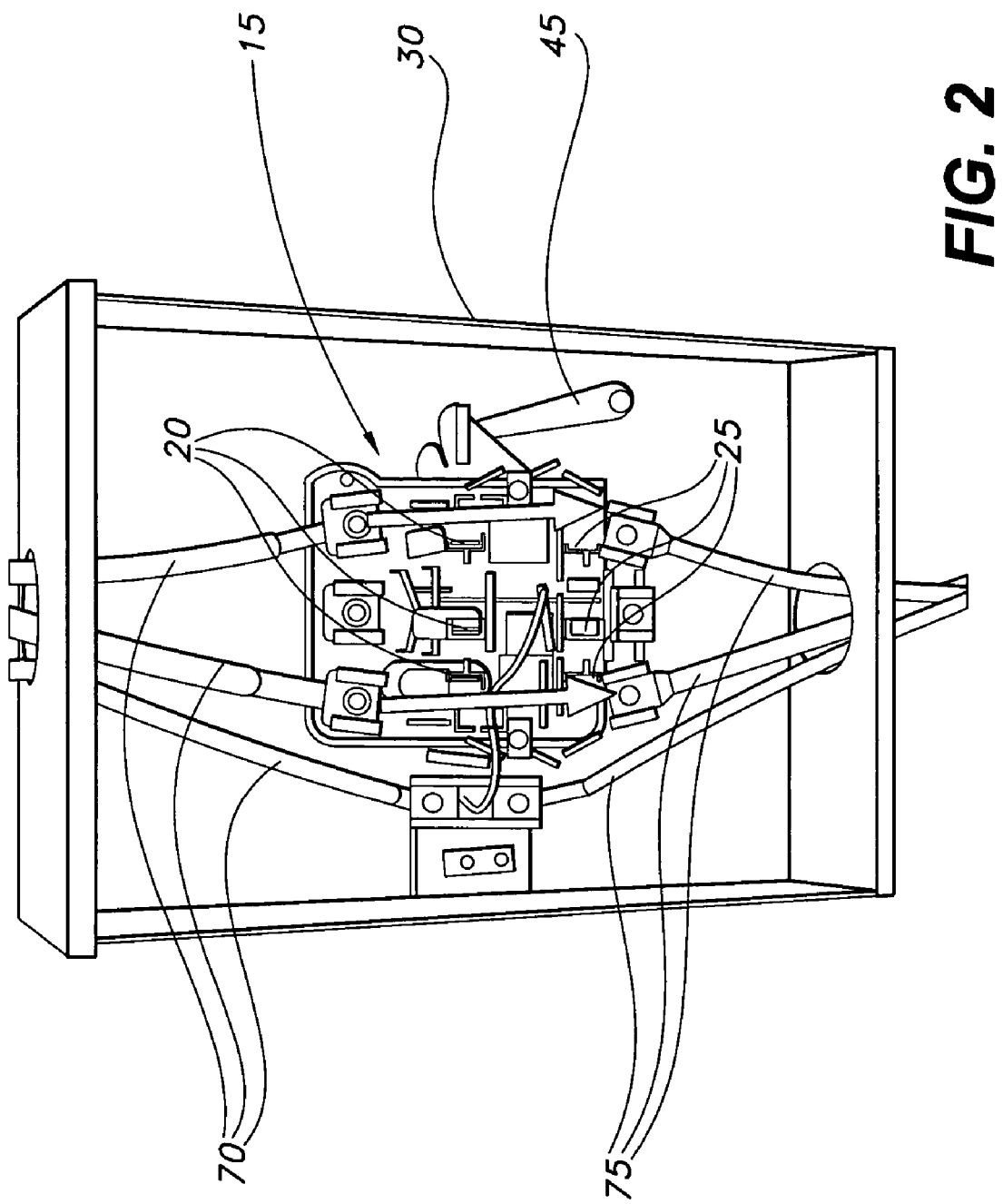
FIG. 2 illustrates a perspective view of a traditional bypass meter socket after a meter has been removed from the meter socket.

Referring now in detail to the drawing figures, wherein like reference numerals represent like parts throughout the several views, a traditional electric meter 50, meter socket box 30, and bypass meter socket 15 are illustrated in FIGS. 1 and 2. The meter socket box 30 typically includes a removable meter socket cover 35 that is sealed to the meter socket box 30 to prevent environmental elements and other foreign objects from damaging the bypass meter socket 15 contained within the meter socket box 30. As dangerously high electric current flows through the electric meter 50, the meter socket cover 35 and meter socket box 30 provide a safety barrier for individuals or objects positioned outside the meter socket box 30.

Many electric meter 50 installations include a bypass meter socket 15. A bypass meter socket 15 is often installed due to the higher amperage of the electricity provided to a customer, or for convenience of a user such as a utility service person to work on a meter without affecting customer service, or for the convenience of the utility service person to completely disrupt customer service, because of nonpayment of services, for example.

One skilled in the art will recognize that a bypass meter socket 15 is adapted to divert electric current (or customer load) away from the customer service. Further, the bypass meter socket 15 may be used to divert electric current from the meter 50 directly to the customer service, such that the customer is not interrupted from service (e.g., the customer is not without power). When the bypass meter socket 15 is bypassed, the connected meter 50 has no electric current flowing through it. Accordingly, the meter 50 is not measuring the current flow of electricity being provided to the customer and the customer does not necessarily know that the meter 50 has been temporarily disconnected.

As commonly practiced within the electric service industry, two-hundred amp meter sockets are not generally designed for bypass. Instead, bypass meter sockets 15 are typically used for those services requiring amperage of 200 or more, where interruption of the customer's service is not desired during temporary removal of the electric meter. Single phase and three phase electricity is often distributed by utility companies. Voltages of such electricity generally run 120/208 volts in three phase and 240 volts in single phase.

While bypass meter sockets 15 provide advantages over non-bypass (traditional) meter sockets, these bypass meter sockets 15 are not designed to be used as a load make or a load break operation device. More specifically, the bypass handle 45 of the bypass meter socket 15 should not be moved between the upper position and the lower position without a meter 50 properly connected within the bypass meter socket 15. Further, manufacturers of the bypass meter sockets 15 often incorporate warning labels on the bypass meter sockets 15 that caution a user about the danger of using the bypass meter socket 15 as a load make or load break operation device. Without a meter 50 properly installed within the bypass meter socket 15, applying a load make or load break may often cause the generation of a dangerous electrical arc between connectors. Such an arc could be deadly to a user such as a utility service person working on the bypass meter socket 15.

Further, manufacturers of bypass meter sockets 15 often provide warning labels discouraging the use of disconnect sleeves 90 (sometimes referred to as boots), which are generally placed over the meter load terminals 85 (shown in FIGS. 1 and 2 as male terminals) and then placed within the meter socket load terminals 25 (shown in FIGS. 1 and 2 as female terminals) of the bypass meter socket 15. In operation, the disconnect sleeves 90 prevent the electric current from flowing through the meter 50 and, therefore, prevent electricity from reaching the customer (e.g., disconnecting the customer) in situations where the customer has not paid for services, for example. The disconnect sleeves 90, however, tend to get lodged into the meter socket load terminals 25 of the bypass meter socket 15, thereby requiring a special tool for removal, or the disconnect sleeves 90 will tear and, therefore, become ineffective or cause other problems with the bypass meter socket 15.

One skilled in the art will recognize that such restrictions on the use of the bypass meter socket 15, preferably single-phase, requires that the utility service person disconnect the customer from service not only when taking the meter 50 out of the bypass meter socket 15, but also when the meter 50 is put back into the bypass meter socket 15. Accordingly, to disconnect a customer from service, a utility service person must remove the meter 50 from the bypass meter socket 15. Subsequently, to reconnect the customer to service, a utility service person must install the meter 50 back into the bypass meter socket 15. Alternatives to perform a disconnect using a bypass meter socket 15 include operating the customer's main breaker to remove the customer load (if the customer's main breaker is accessible to the utility service person), operating a line side disconnect device connected ahead of the meter 50 (if such a device has been installed), disconnecting the service at the weather head, or disconnecting the service at the transformer servicing the customer. Such alternatives are not always feasible or are labor intensive and, thus, expensive.

As illustrated in FIG. 2, a traditional bypass meter socket 15 generally includes several meter socket line terminals 20 (female) connected to line wires 70 (e.g., line wires 70) bringing in an electric current from the utility company, several meter socket load terminals 25 (female) connected to load wires 75 (e.g., customer wires) providing received electricity to the customer, and a bypass lever 45 adapted to direct current away from the customer service or directly to the customer service, thereby bypassing the bypass meter socket 15.

A traditional meter 50 typically includes meter line terminals 80 (male) and meter load terminals 85 (male) adapted to engage the meter socket line terminals 20 and meter socket load terminals 25, respectively. The meter 50 provides a connection between the line wires 70 and the load wires 75, such that electricity may flow from the utility line source to the customer for use. As electric current flows from the meter line terminals 80 to the meter load terminals 85, the meter 50 records the wattage provided to the customer service. The measure of wattage provided to the customer is subsequently used for charging the customer for service of electricity.

When the bypass meter socket 15 is not in the bypass mode, electricity cannot travel from the meter socket line terminals 20 to the meter socket load terminals 25 without a meter 50 installed to connect the two. Accordingly, removal of the meter 50 will disconnect a customer service, unless the bypass meter socket 15 is bypassed prior to removal of the meter 50.

Figure 3:
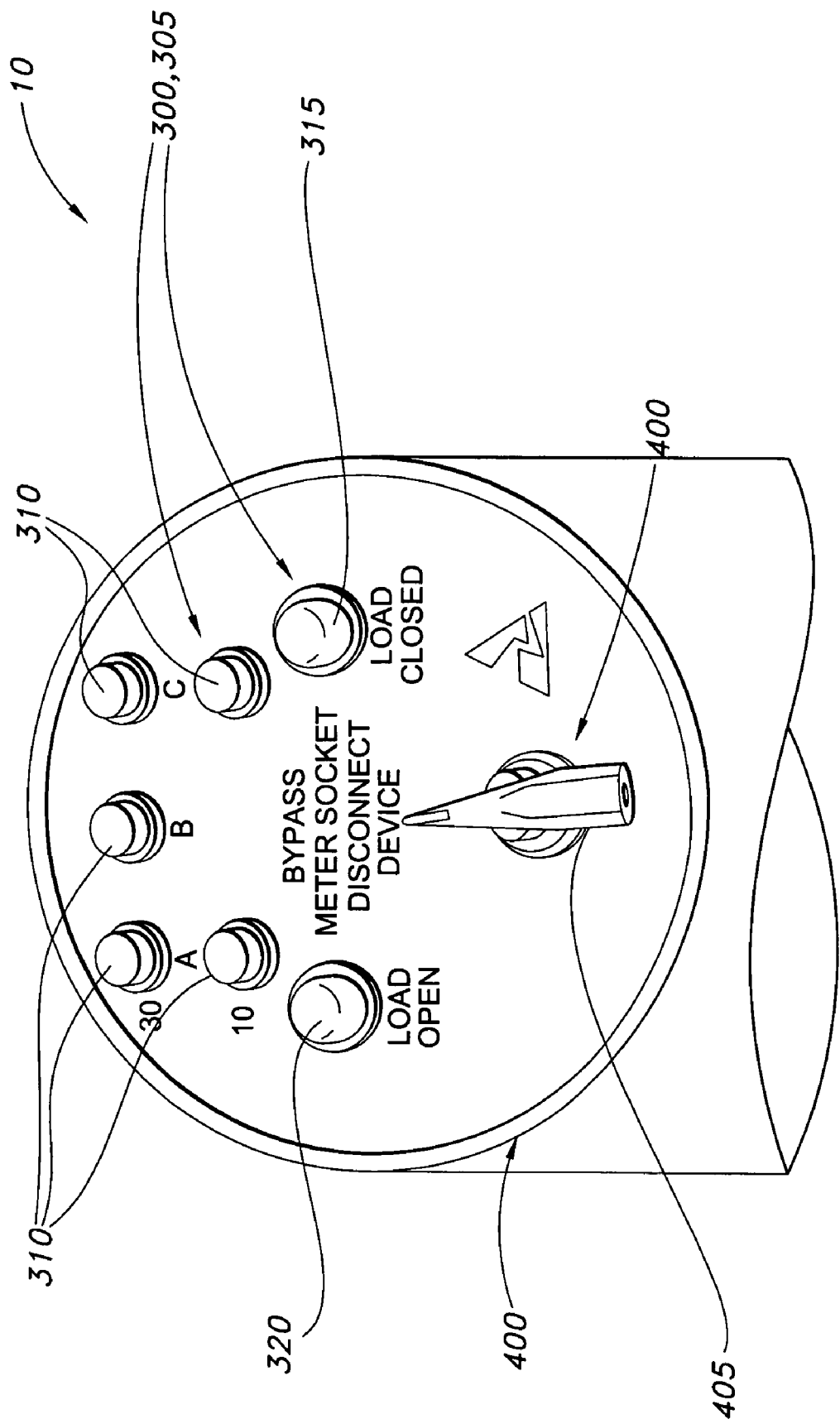
FIG. 3 illustrates a perspective view of a meter socket bypass disconnect device in accordance with an embodiment of the present invention.

A meter socket bypass disconnect device 10, as illustrated in FIG. 3, is designed to allow a service disconnect using a bypass meter socket 15. Further, the meter socket bypass disconnect device 10 is designed to permit the bypass meter socket 15 to handle a load make or a load break after a meter 50 has been disconnected with the bypass meter socket 15. The meter socket bypass disconnect device 10 prevents the bypass meter socket 15 from experiencing a deadly arc when a utility service person makes a load or breaks a load using the bypass meter socket 15. The meter socket bypass disconnect device 10, therefore, permits the utility service person to safely conduct a service disconnect using a bypass meter socket 15. Although the meter socket bypass disconnect device 10 may be of various shapes and sizes, the exemplary meter socket bypass disconnect device 10 shown in FIG. 3 is the approximate size of a standard electric meter 50.

When in a load closed state (and connected to the bypass meter socket 15), the meter socket bypass disconnect device 10 simulates the same conditions as the electric meter 50, which has previously been removed. More specifically, the electric current or the load would flow from the line wires 70 (e.g., line wires 70), through the meter socket bypass disconnect device 10, to the load wires 75 (e.g., customer wires) leading to service the customer. In the load closed state, therefore, the meter socket bypass disconnect device 10 does not interrupt the electric current flowing through it.

When in a load open state (and connected to the bypass meter socket 15), the meter socket bypass disconnect device 10 breaks the load flowing internally through it, without the risk of creating a deadly arc. Accordingly, the load on the bypass meter socket 15 is broken, without the use of the bypass handle 45 of the bypass meter socket 15. Such an operation is necessary and desirable for disconnecting service using a bypass meter socket 15. The meter socket bypass disconnect device 10, therefore, eliminates the need to utilize more expensive and less feasible alternatives for disconnecting service to a customer.

The meter socket bypass disconnect device 10 is further designed to accommodate electric current having single phase and three phase operations. Accordingly, the meter socket bypass disconnect device 10 provides a utility service person with the convenience of not having to use one device for single phase operation and a second device for three phase operation.

As illustrated in FIG. 3, the meter socket bypass disconnect device 10 comprises a housing 100, a disconnect system 200 adapted to interface with the bypass meter socket 15, an indication system 300 adapted to indicate an open and closed load and the corresponding phase of electricity, and a switching system 400 adapted to move the meter socket bypass disconnect device 10 from the load closed state to the load open state and vice versa. The disconnect system 200, the indication system 300, and the switching system 400 are containable or partially containable within the housing 100.

More specifically, the disconnect system 200 is adapted to engage the meter socket line terminals 20 and meter socket load terminals 25 of the bypass meter socket 15. When engaged with the bypass meter socket 15, the disconnect system 200 remains in constant communication with the bypass meter socket 15, such that the disconnect system 200 maintains the meter socket bypass disconnect device 10 in a position adjacent to the bypass meter socket 15. In an exemplary embodiment of the present invention, the disconnect system 200 permits the meter socket bypass disconnect device 10 to plug into the female terminals (e.g., meter socket line terminals 20 and meter socket load terminals 25) of the bypass meter socket 15.

The indication system 300 is adapted to distinguish the voltage of the electric current flowing through the meter socket bypass disconnect device 10 and, therefore, distinguish between single phase and three phase power. Depending on the phase of the electricity, the indication system 300 provides a utility service person with a corresponding indication as to whether the electricity is single phase or three phase. Further, the indication system 300 may determine the state of the switching system 400, such that the indication system 300 may determine whether the meter socket bypass disconnect device 10 is in a load closed state or a load open state. Moreover, the indication system 300 is adapted to provide a utility service person with a corresponding indication as to whether the meter socket bypass disconnect device 10 is in the load closed state or the load open state.

The switching system 400 permits a utility service person to move the meter socket bypass disconnect device 10 from the load closed state to the load open state. Accordingly, the switching system 400 is adapted to make load and break load through the bypass meter socket 15, without reliance on the bypass lever 45 of the bypass meter socket 15. Moving the meter socket bypass disconnect device 10 from the load closed state to the load open state permits the utility service person to disconnect service from a customer through the bypass meter socket 15.

Figure 4:
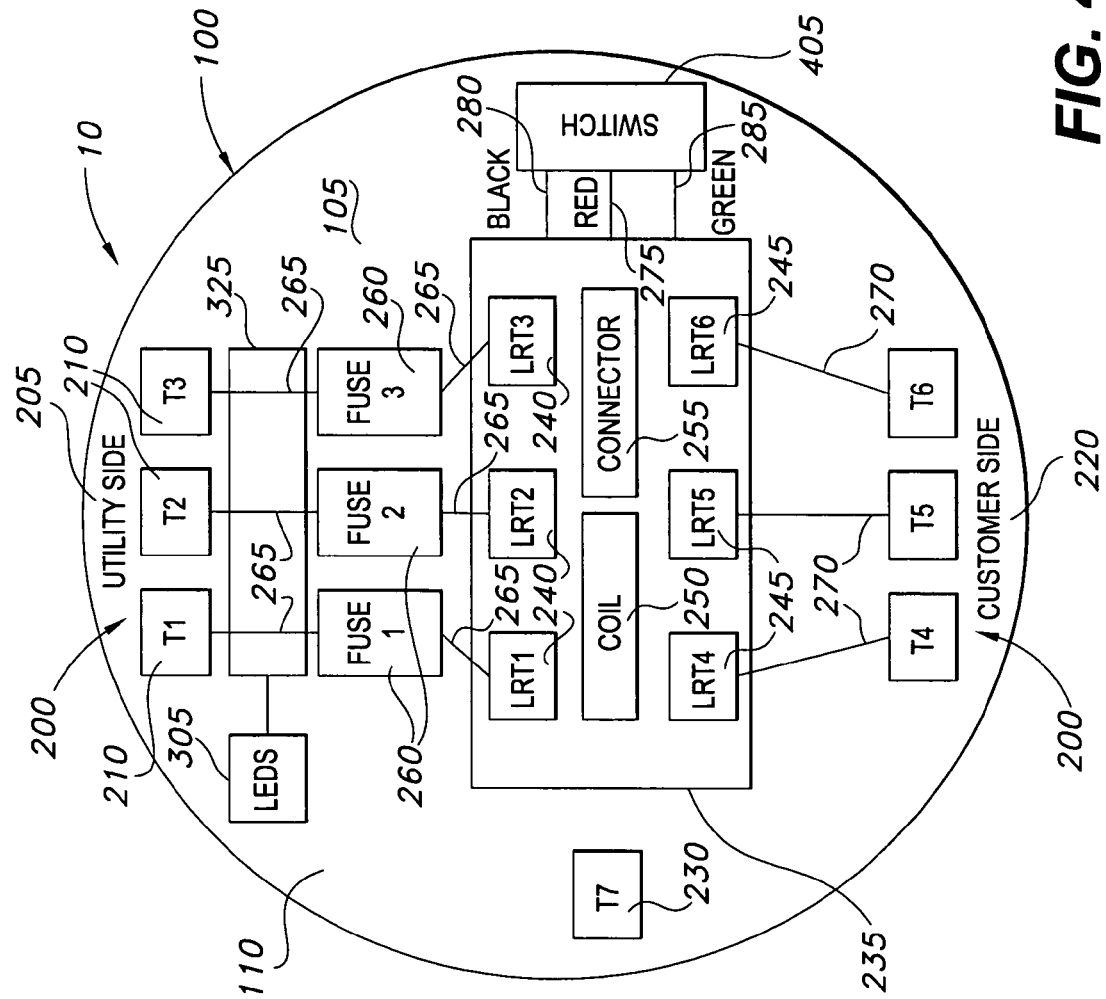
FIG. 4 illustrates a perspective view of a base of the meter socket bypass disconnect device in accordance with an embodiment of the present invention.
Figure 5:
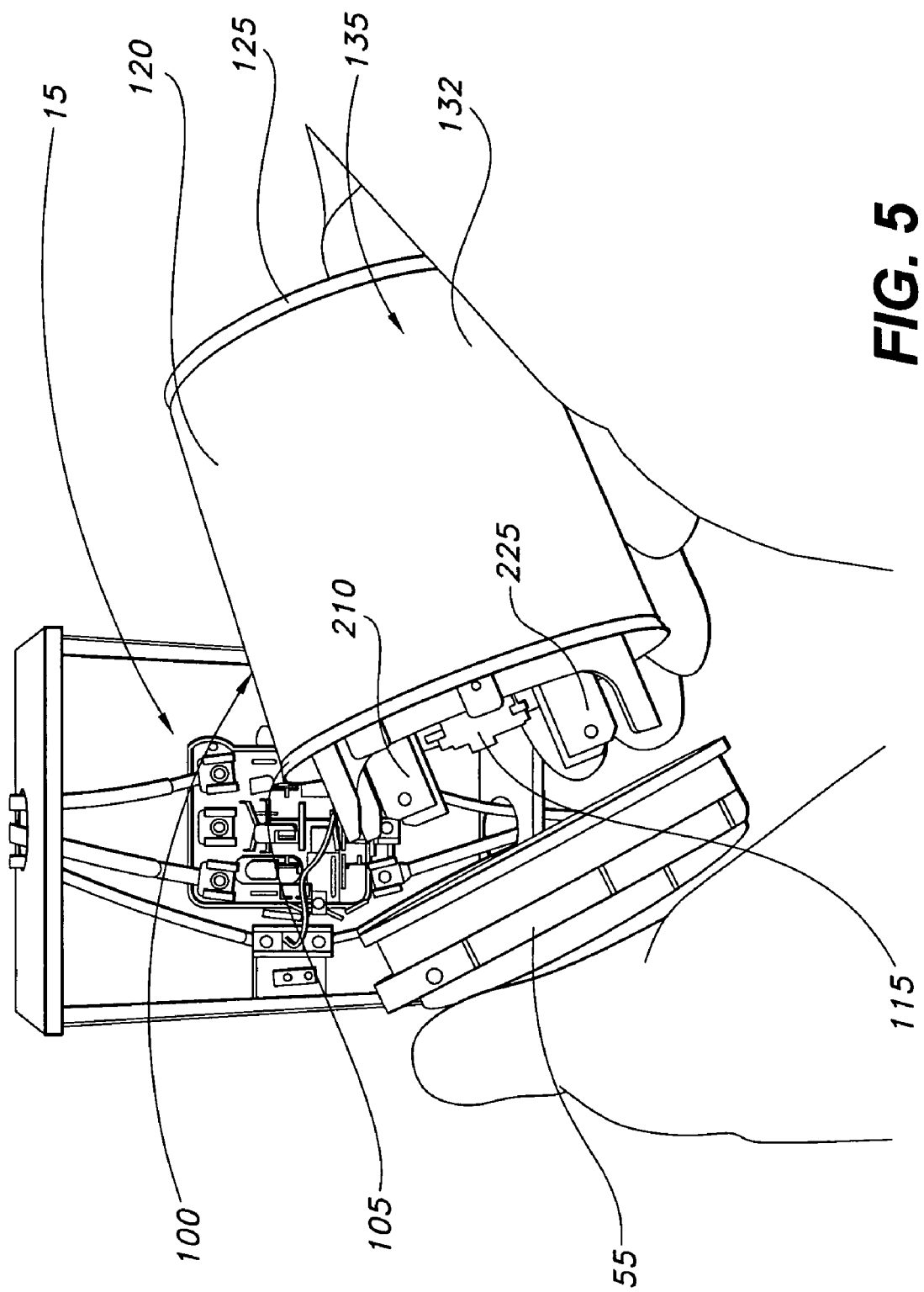
FIG. 5 illustrates a perspective view of a meter socket bypass disconnect device with a meter socket extender in accordance with an embodiments of the present invention.

As illustrated in FIGS. 3, 4, and 5, an exemplary housing 100 according to the present invention comprises a base 105 and a cover 120, such that the cover 120 is in communication with the base 105. In an exemplary embodiment of the present invention, the cover 120 is bolted onto the base with a plurality of bolts (not shown). One skilled in the art, however, will recognize that the cover 120 may be fastened to the base 105 by various appropriate methods of attachment.

As shown in FIGS. 3-5, the base 105 of the housing 100 comprises a first aspect 110 and a second aspect 115, such that the first aspect 110 of the base is adjacent to the cover 120 and the second aspect 115 of the base 105 is adapted to interface with the bypass meter socket 15. The cover 120 of the housing 100 includes a closed first aspect 125, an open second aspect 130 (not shown), and a peripheral wall 132 that extends from the closed first aspect 125 to the open second aspect 130, thereby forming a hollow cavity within the cover 120 (e.g., below the closed first aspect 125 of the cover 120). The open second aspect 130 of the cover 120 is adapted to engage the first aspect 110 of the base 105.

The housing 100 may further comprise indicators 135 or directions positioned on the peripheral wall 132 of the cover 120, in order to inform the utility service person about predetermined aspects or characteristics of the meter socket bypass disconnect device 10. For example, the indicators 135 may include instructions on how to use the meter socket bypass disconnect device 10 to disconnect service to a customer though the bypass meter socket 15.

Still further, the housing 100 comprises a sealing element 140 (not shown) that is in communication with the perimeter of the first aspect 110 of the base 105 and the perimeter of the open second aspect 130 of the cover 120. The sealing element 140 is adapted to seal the base 105 to the cover 120, thereby providing a type of weather protection to the meter socket bypass disconnect device. The sealing element 140 may be, but is not limited to, a rubber gasket or an o-ring. Although the sealing element 140 may be used to completely weather proof the meter socket bypass disconnect device 10, the meter socket bypass disconnect device 10 is intended for use as a piece of test equipment and, therefore, would not normally be left connected to a meter socket 15 for extended periods of time. Generally, the meter socket bypass disconnect device 10 is recovered by the utility service person prior to completing service of a particular meter socket 15.

One skilled in the art will recognize that the base 105 and cover 120 of the housing 100 may be of many convenient shapes and sizes. In an exemplary embodiment of the present invention, the base 105 is approximately the same diameter as a common electric meter 50, so that the base 105 may adequately interface with the bypass meter socket 15. Accordingly, the base 105 has a diameter of approximately five or six inches. The cover 120 has a diameter approximate to the diameter of the base 105, thereby permitting the cover 120 to properly engage the base 105 of the housing 100. The peripheral wall 132 of the cover 120 is approximately six inches long, such that the cover 120 is approximately six inches deep from the closed first aspect 125 to the open second aspect 130.

In an exemplary embodiment, cover 120 comprises a plurality of sections that are molded together, wherein the plurality of sections range in length from one inch to three inches. The plurality of sections of the cover 120 may be fused together to create a cover 120 of a desired length, such as six inches. For example, the length of the cover 120 may be approximately equal to the length of the standard electric meter 50.

One skilled in the art will also recognize that the housing 100 of the meter socket bypass disconnect device 10 may be made of a variety of suitable materials, including, but not limited to, fiberglass and polycarbonate. The housing 100 may be made of materials that serve as insulation and, therefore, do not conduct electricity, while being durable enough to last in the utility services field. For example, the housing 100 may be made of the same material used to create a standard electric meter 50.

The disconnect system 200 is in communication with the first aspect 110 and second aspect 115 of the base 105. The disconnect system 200 defines regions on the first aspect 110 of the base 105. More specifically, the disconnect system 200 comprises a line side 205 and a load side 210, such that the line side 205 is represented by a first edge of the first aspect 110 of the base 105, while the load side 210 is represented by a second opposite edge of the first aspect 110 of the base 105. The line side 205 and the load side 210 of the disconnect system 200 correspond with the meter socket line terminals 20 and meter socket load terminals 25 of the bypass meter socket 15, respectively.

The disconnect system 200 comprises a plurality of line side terminals 210 (e.g., utility network terminals), a plurality of load side terminals 225 (e.g., customer load terminals), a ground terminal 230, and a latching relay 235. The plurality of line side terminals 210 is generally positioned near the line side 205 of the first aspect 110 of the base 105, while the plurality of load side terminals 225 is generally positioned near the load side 220 of the first aspect 110 of the base 105. The ground terminal 230 is generally positioned between the line side 205 and load side 220 near a third edge of the first aspect 110 of the base 105.

The plurality of line side terminals 210, the plurality of load side terminals 225, and the ground terminal 230 extend through the base 105, such that a first portion of each terminal is located on the first aspect of the base 105, while a second portion of each terminal extends outwardly from the second aspect 115 of the base 105. Accordingly, the base 105 is defined to form a plurality of apertures that permits the second portion of each terminal to pass through the base 105 and extend outwardly from the base 105. Generally, the second portion of each terminal extends approximately perpendicular from the second aspect 115 of the base 105. Further, the first portion of each terminal is adapted to secure the terminal to the first aspect 110 of the base 105.

As positioned, the plurality of line side terminals 210, the plurality of load side terminals 225, and the ground terminal 230 are approximately aligned with the meter socket line terminals 20, meter socket load terminals 25, and a meter socket ground terminal (not shown). Indeed, when the second aspect 115 of the base 105 is engaged with the bypass meter socket 15, the plurality of line side terminals 210 adequately engage a corresponding plurality of meter socket line terminals 20, the plurality of load side terminals 225 adequately engage a corresponding plurality of meter socket load terminals 25, and the ground terminal 230 adequately engages a corresponding meter socket ground terminal.

The disconnect system 200 generally includes an equal number of line side terminals 210 as the bypass meter socket 15 has meter socket line terminals 20 and includes an equal number of load side terminals 225 as the bypass meter socket 15 has meter socket load terminals 25. In an exemplary embodiment of the present invention, the disconnect system 200 includes three line side terminals 210 and three load side terminals 225.

The latching relay 235 is positioned on the first aspect 110 of the base 105, such that the latching relay 235 is in communication with the plurality of line side terminals 210 and the plurality of load side terminals 225. The latching relay 235 itself comprises a plurality of first terminals 240, a plurality of second terminals 245, a coil 250, and a connector 255 (also referred to as a contactor 255). Generally, the number of first terminals 240 corresponds to the number of line side terminals 210 and the number of second terminals 245 corresponds to the number of load side terminals 225. As such, the latching relay 235 is arranged such that the first terminals 240 are positioned near the line side terminals 210 and the second terminals 245 are positioned near the load side terminals 225.

Further, the disconnect system 200 comprises a buswork 265 and a plurality of busbars 270 adapted to connect the first terminals 240 of the latch relay 235 with the line side terminals 205 and to connect the second terminals 245 of the latch relay 235 with the load side terminals 225. One skilled in the art will recognize that busbar 270 is a conductor that serves as a common connection of two or more electrical circuits, while buswork 270 is a group of two or more busbars 270. In the present invention, the buswork 265 connects the line side terminals 205 with the first terminals 240 of the latch relay 235 and the plurality of busbars 270 connect the load side terminals 225 with the second terminals 245 of the latch relay 235.

A plurality of fuses 260 are shown in communication with the line side terminals 205 of the disconnect system 200 and the first terminals 240 of the latching relay 235. More particularly, there is generally one corresponding fuse 260 for each line side terminal 205. The buswork 265, therefore, connects each line side terminal 205 with a first end of a corresponding fuse 260 and then connects a second end of the corresponding fuse 260 to the appropriate upper terminal 240. An electric current received by the line side terminals 205 must flow through the fuses 260 prior to reaching the first terminals 240 of the latching relay 235.

The plurality of fuses 260 provides an extra safety measure to protect the utility service person from the danger of the electric current. While a variety of suitable fuses 260 may be used, in an exemplary embodiment of the present invention, each of the fuses 260 comprises a one-hundred amp fast-acting fuse. Fuses of different amperage may be used depending on the electric current provided by the utility line source, but normally one-hundred amp fuses 260 per phase or per leg cover the largest percentage of loads that would be require to be broken by a utility service person via the bypass meter socket 15.

The connector 255 of the latching relay 235 has an open position and a closed position. In the open position (load break), an electric current may be received by the first terminals 240 but will not be passed to the second terminals 245, because the electric current cannot travel successfully over the connector 255. In the closed position (load make), an electric current may be received by the first terminals 240 and provided to the second terminals 245, because the electric current may successfully travel over the connector 255.

The latching relay 235 further comprises three wires: a first color wire 275, a third color wire 285, and a second color wire 280. A combinational use of the first color wire 275 and the third color wire 285 perform a first operation, while a combinational use of the second color wire 280 and the third color wire 285 perform a second operation. In the first operation, the connector 255 of the latching relay 235 is closed. In the second operation, the connector 255 of the latching relay 235 is opened. The first color wire 275, third color wire 285, and second color wire 280 are in communication with the switching system 400, such that the switching system 400 may move the latching relay 235 between the first operation (e.g., the closed position) and the second operation (e.g., the open position). One skilled in the art will recognize that many appropriate types of wiring may be used for the first color wire 275, third color wire 285, and second color wire 280. In an exemplary embodiment of the present invention, the first color wire 275, third color wire 285, and second color wire 280 comprise typical 16/18 gauge, 600 volt insulated wiring.

The coil 250 is adapted to maintain the connector 255 in the closed and open positions when a predetermined power supply is provided to the coil 250. In an exemplary embodiment of the present invention, the coil 250 derives its power from a twelve volt direct current (DC). Accordingly, an input of varying volts, such as a range from 90 volts up to 267 volts, may be used to output the necessary twelve volt DC provided to the coil 250. Moreover, a twelve volt DC output may be generated from the 240 volts provided during single phase applications, and may also be generated from the 120/208 volts provided during three phase applications.

The indication system 300 is in communication with the base 105 and the closed first aspect 125 of the cover 120. The indication system 300 comprises a plurality of light indicators 305 and a voltage distinguishing relay 325 adapted to distinguish the electric current as single phase or three phase. The voltage distinguishing relay 325 is generally positioned between the line side terminals 210 and the first terminals 240 of the latching relay 135. The plurality of light indicators 305 may be positioned on the closed first aspect 125 of the cover 120 of the housing 100, such that a utility service person may easily see the plurality of light indicators 305 when the meter socket bypass disconnect device 10 is connected to the bypass meter socket 15.

The plurality of light indicators 305 are divided into a plurality of phase light indicators 310, a load closed indicator 315, and a load open indicator 320. One skilled in the art will recognize that various types of light indicators may be appropriately used within the scope of the present invention, such as, but not limited to, pilot lamps and incandescent bulbs. The plurality of light indicators 305 may be light-emitting diodes (LEDs), wherein the plurality of phase light indicators 310 are color[1] LEDs, the load closed indicator 315 is a color[3] LED, and the load open indicator 320 is a color[2] LED.

In an exemplary embodiment according to the present invention, the plurality of phase light indicators 310 may comprise five color[1] (e.g., amber) LEDs, each having a rating of approximately 110 volts alternating current (AC). Three of the phase light indicators 310 are rated to indicate a phase to ground voltage of 120 volts on a three phase application, whereby a first phase light indicator 310 represents an A phase, a second phase light indicator 310 represents a B phase, and a third phrase light indicator 310 represents a C phase. Two of the phase light indicators 310 are electrically connected together internally to go across a 240 volt single phase.

When the meter socket bypass disconnect device 10 is connected to the bypass meter socket 15, the voltage distinguishing relay 325 determines whether the electric current is single phase or three phase. If the electric current is single phase, the voltage distinguishing relay 325 activates the two phase light indicators 310 representing single phase operation. If the electric current is three phase, the voltage distinguishing relay 325 activates the appropriate phase light indicators 310 representing the A phase, B phase, and C phase of the three phase operation. The phase light indicators 310 representing single phase operation and the phase light indicators 310 representing three phase operation will not be activated simultaneously by the voltage distinguishing relay 325. The phase light indicators 310, therefore, may provide the utility service person with the correct phase of electricity flowing through the bypass meter socket 15. The voltage distinguishing relay 325 may be configured to recognize the presence or absence of voltage, such that the voltage distinguishing relay 325 may determine which ones of the phase light indicators 310 will be illuminated and which phase light indicators 310 will not be illuminated.

The load closed indicator 315 (e.g., red LED) and the load open indicator 320 (e.g., green LED) are typically twelve volt DC LEDs. The load open indicator 320 is labeled "load open," while the load closed indicator 315 is labeled "load closed." Depending on the position of the latching relay 235, either the load open indicator 320 will be illuminated or the load closed indicator 315 will be illuminated. More particularly, if the latching relay 235 is in the open position, then the load open indicator 320 will be illuminated. If the latching relay 235 is in the closed position, then the load closed indicator 315 will be illuminated. Accordingly, the utility service person may determine whether a load make or load break is being applied to the bypass meter socket 15.

The switching system 400 comprises a switch 405 in communication with the latching relay 235 via the first color wire 275, third color wire 285, and second color wire 280. The switch 405 is adapted to move the latching relay 235 from the closed position to the open position and vice versa. Generally, the switch 405 is positioned on the closed first aspect 125 of the cover 120 of the housing 100, such that a utility service person may easily access the switch 405 when the meter socket bypass disconnect system 10 is connected to the bypass meter socket 15. More specifically, the switch 405 is adapted to activate the first color wire 275 and third color wire 285, thereby activating the latch relay 235 to the closed position, and to activate the second color wire 280 and third color wire 285, thereby activating the latch relay 235 to the open position.

The switch 405 may have a pointer adapted to point to the load closed indicator 315, when the latching relay 235 is in the closed position and to the load open indicator 320, when the latching relay 235 is in the open position. In other words, when the switch 405 is pointing to the load closed indicator 315, the meter socket bypass disconnect device 10 simulates the same condition as the traditional electric meter 50 that was removed from the bypass meter socket 15. The load will flow through the meter socket bypass disconnect device 10 uninterrupted, just as if the load was flowing through a meter 50 to the customer. When the switch 405 is pointing to the load open indicator 320 the load is broken within the meter socket bypass disconnect device 10 and, therefore, the load has been broken on the bypass meter socket 15.

One skilled in the art will recognize that the switch 405 may be of many particular designs or suitable sizes. In an exemplary embodiment of the present invention, the switch 405 is made of durable material and resembles a heavy contactor type switch. In an exemplary embodiment of the present invention, the switch 405 is generally circular in design having a depth of approximately two inches and a diameter of approximately one inch.

Figure 6:
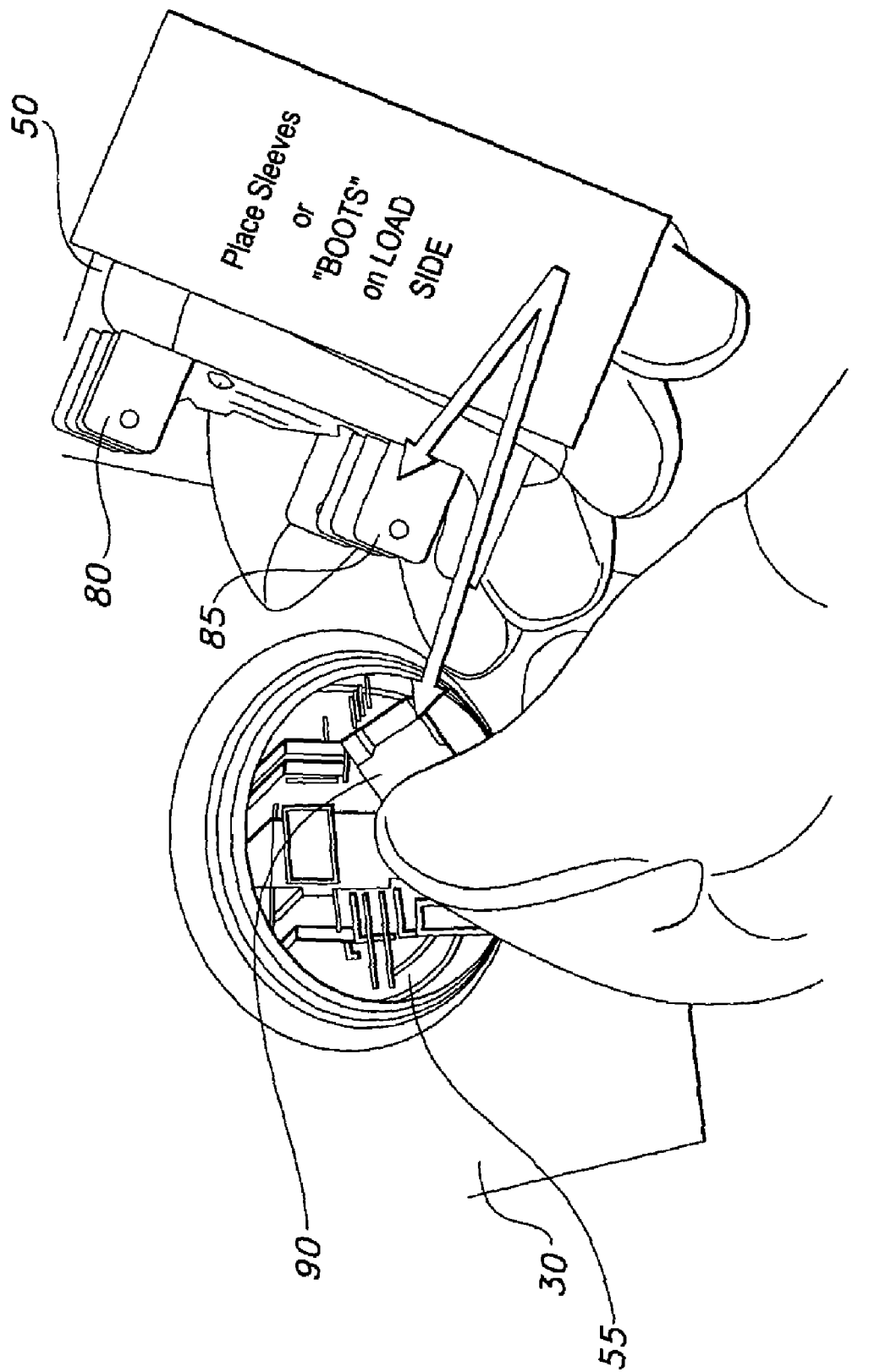
FIG. 6 illustrates an exemplary method of disconnecting electric service using a meter socket bypass disconnect device in accordance with an embodiment of the present invention.
Figure 7A:
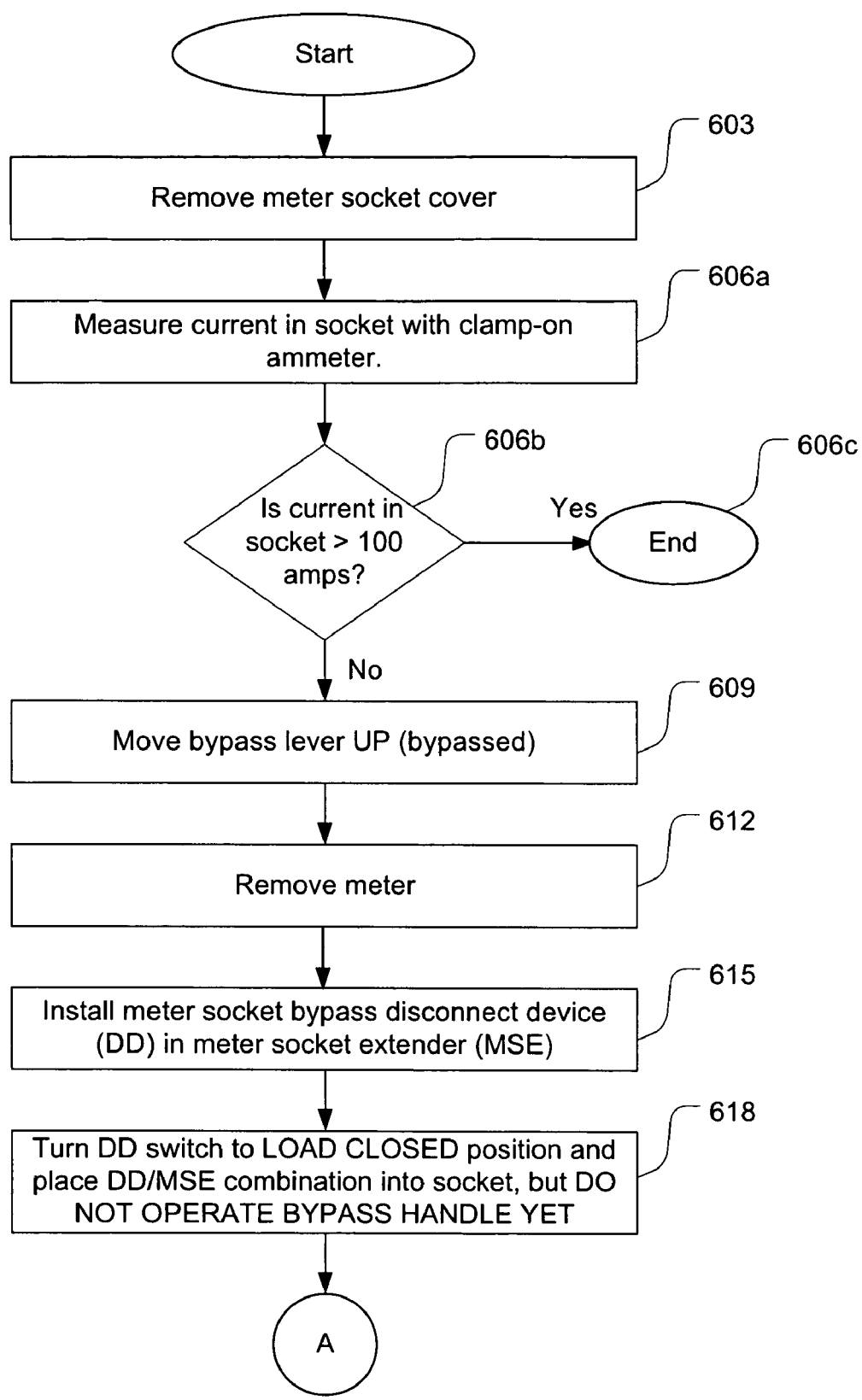
FIGS. 7A-C provide a flowchart providing the details of the steps of an exemplary method of disconnecting electric service using a meter socket bypass disconnect device in accordance with an embodiment of the present invention.

FIGS. 6-7A-C illustrate a method 600 of disconnecting electric service using a meter socket bypass disconnect device 10 in accordance with exemplary embodiments of the present invention. In operation, the meter socket bypass disconnect device 10 permits a utility service person to safely disconnect a bypass meter socket 15, when making load and/or breaking load is necessary after the meter 50 has already been removed from the bypass meter socket 15. Indicators 135 located along the peripheral wall 132 of the cover 120 may include directions for disconnecting electric service using a meter socket bypass disconnect device 10, such that the indicators 135 include a description of each step of the method 600 as described below.

Figure 7B:
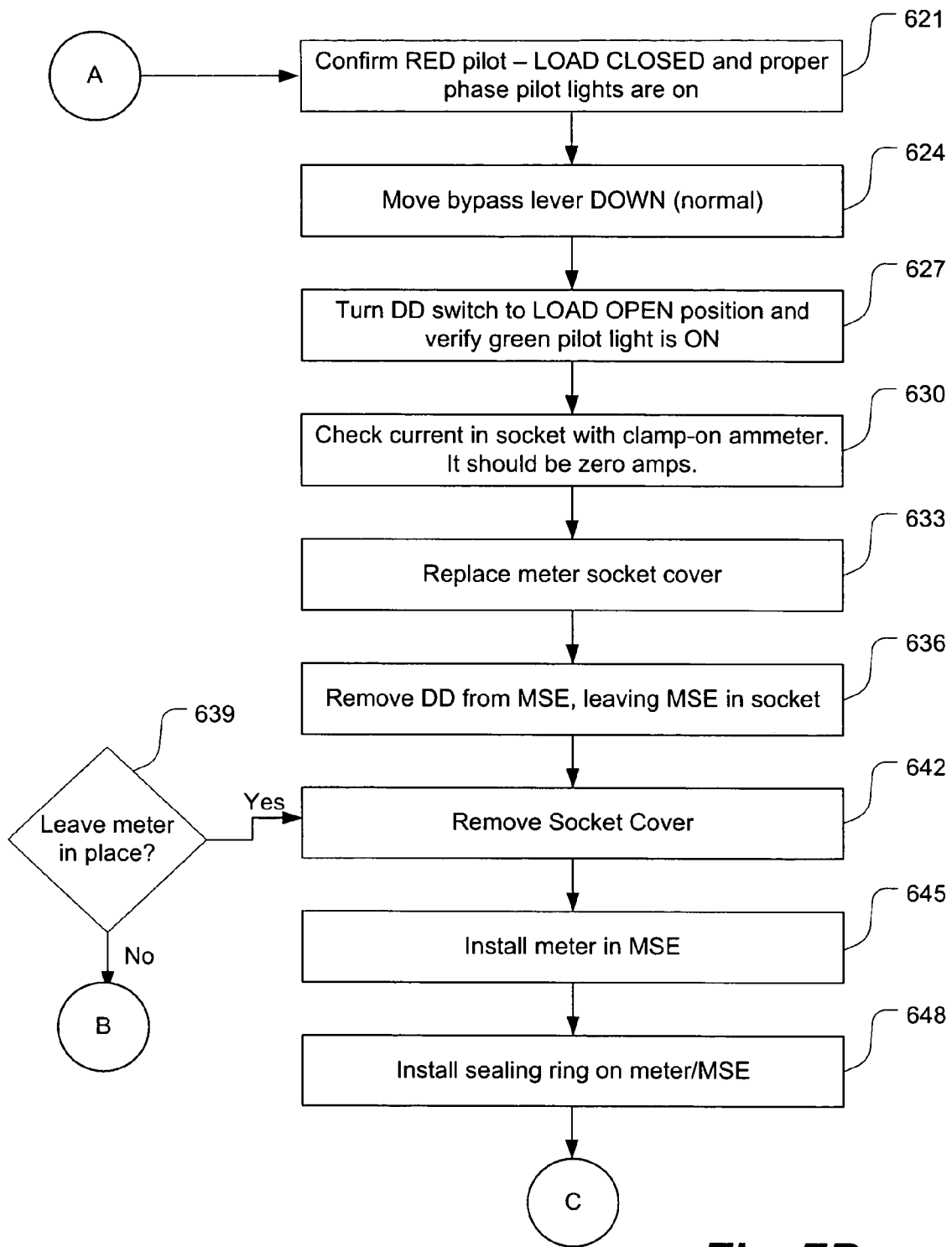
Figure 7C:
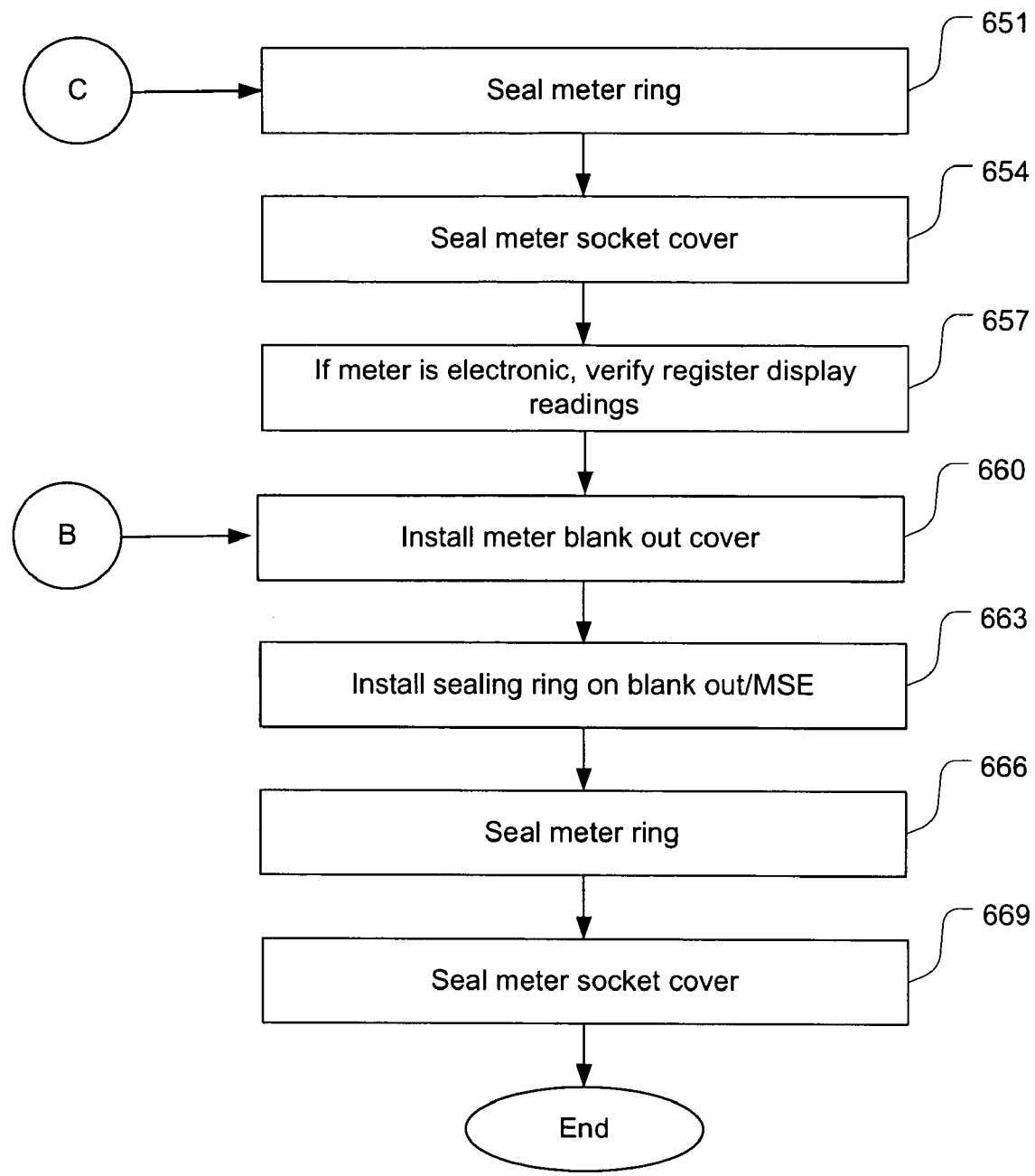

Referring now to the flowchart of FIG. 7A-C, in which the steps of an exemplary method of disconnecting electric service using a meter socket bypass disconnect device in accordance with the present invention, the method 600 of disconnecting electric service using a meter socket bypass disconnect device 10 comprises the steps beginning at 603 where the meter socket cover 35 is removed from the meter socket box 30. At 606a and 606b, the current of the bypass meter socket 15 is measured using an ammeter or other appropriate measuring device. More specifically, a clamp-on ammeter may be connected to each of the line wires 70 (e.g., line wires) in communication with the meter socket line terminals 20. If the amperage measured by the ammeter is greater than 100 amps, then operation is terminated as shown at 606c.

If the amperage measured by the ammeter is equal to or less than 100 amps, then at 609 the bypass lever 45 of the bypass meter socket 15 is activated (e.g., moved upwards), such that the electric current bypasses the meter. During the bypass of the meter, the electric current may still be provided to the load wires 75 (e.g., customer wires), so that the customer does not experience interruption in service.

Next, at 612, the meter 50 may be physically removed from the bypass meter socket 15. The bypass meter socket 15 is not adequately designed to handle a load make or load break without a meter 50 connected to the bypass meter socket 15. Such a load make or load break could create a deadly arc within the bypass meter socket 15 when no meter 50 or appropriate device is in place. Accordingly, manufacturers of the meter sockets 15 generally provide warning labels cautioning the utility service person not to make load or break load on the bypass meter socket 15 when the meter 50 has been disconnected.

At 615, a meter socket extender 55 is installed onto the meter socket bypass disconnect device 10. More specifically, the meter socket extender 55 is designed with appropriate female terminals adapted to receive the male terminals 210, 225, 230 extending from the base of the meter socket bypass disconnect device 10. Further, the meter socket extender 55 includes corresponding male terminals extending from the second aspect of the meter socket extender 55. As designed, the meter socket extender 55 establishes a connection between the line side terminals 210 (e.g., line terminals) of the meter socket bypass disconnect device 10 and corresponding line terminals of the meter socket extender 55, while establishing a connection between the load side terminals 225 (e.g., load terminals) of the meter socket bypass disconnect device 10 and corresponding load terminals of the meter socket extender 55. Consequently, an electric current may flow through the line terminals of the meter socket extender 55 to the connected utility side terminals 210, thereby allowing the electric current to flow through the meter socket bypass disconnect device 10 to the load side terminals 225 and then to the connected load terminals of the meter socket extender 55.

The meter socket extender 55 is adapted to connect securely to the second aspect 115 of the base 105 of the meter socket bypass disconnect device 10. Accordingly, the meter socket extender 55 extends the length of the meter socket bypass disconnect device 10 for operation with the bypass meter socket 15, as discussed below.

Next, at 618, the switch 405 of the meter socket bypass disconnect device 10 is turned to the load closed position prior to insertion of the meter socket bypass disconnect device 10 into the bypass meter socket 15. After the switch 405 has been set to the load closed position, the meter socket bypass disconnect device 10 (with the meter socket extender 55) is connected to the bypass meter socket 15. As the switch 405 has been turned to the load closed position, the load closed light indicator 315 (e.g., red LED) is illuminated. The load closed light indicator 315 is adapted to provide the utility service person with an indication that the meter socket bypass disconnect device 10 is in the load closed position.

Additionally, the phase light indicator 310 is illuminated based on the electricity phase. For example, if the electricity is single phase, then the lower two of the five color[1] LEDs are illuminated to provide the utility service person with an indication that there exists single phase electricity. Similarly, if the electricity is three phase, then the upper one, two, or three of the five color[1] LEDs are illuminated to provide the utility service person with an indication that there exists three phase electricity. The voltage distinguishing relay 325 of the meter socket bypass disconnect device 10 is adapted to determine whether the electricity is single phase or three phase and, based on the determination, illuminates the appropriate color[1] LEDs located on the closed first aspect 125 of the cover 120 of the housing 100.

Then, at 621, the utility service person examines the light indicators 305 to determine if the meter socket bypass disconnect device 10 is in the load closed position (e.g., the load closed light indicator 315 is illuminated) and whether the correct electricity phase is indicated on the phase light indicators 310. Making such a determination is important before making load or breaking load on the bypass meter socket 15 and meter socket bypass disconnect device 10. If the utility service person determines that the load closed light indicator 315 is not illuminated or that the appropriate phase light indicators 310 (representing the phase of the electricity) are not illuminated, then the utility service person terminates operation in accordance with method 600.

If, however, at 621, the utility service person determines that the load closed light indicator 315 is properly illuminated and the appropriate phase light indicators 310 are properly illuminated, then the utility service person may move the bypass lever 45 of the bypass meter socket 15 to the normal position (e.g., down), at 624. By moving the bypass lever 45 to the normal position, a load make is applied to the bypass meter socket 15 and the meter socket bypass disconnect device 10. As currently configured, the switch 405 of the meter socket bypass disconnect device 10 is in the load closed position, the bypass lever 45 is in the normal position (e.g., down), and a load is currently flowing through the meter socket bypass disconnect device 10.

Next, at 627, the utility service person moves the switch 405 to the load open position. As the switch 405 is moved from the load closed position to the load open position, the load closed light indicator 315 fades out, while the load open light indicator 320 (e.g., a green LED) is illuminated. Once the switch 405 is moved, the utility service person may verify that the load open light indicator 320 is, indeed, illuminated.

At 630, the current of the bypass meter socket 15 is measured using an ammeter or other appropriate measuring device. As described above, a clamp-on ammeter may be connected to each of the line wires 70 (e.g., utility line wires) in communication with the meter socket line terminals 20. If the amperage measured by the ammeter is substantially greater than zero amps, then operation is terminated in accordance with method 600.

If the amperage measured by the ammeter is approximately zero amps, then at 633 the meter socket cover 35 is replaced on the meter socket box 30. Next, at 636, the meter socket bypass disconnect device 10 is removed from the meter socket extender 55 and, therefore, the bypass meter socket 15. The meter socket extender 55 is left connected within the bypass meter socket 15.

Then, at 639, a determination is made as to whether the original meter 50 will be left with the bypass meter socket 15. If, at 639, the determination is made that the original meter 50 will be left with the bypass meter socket 15, then the utility service person, at 642, may install disconnect sleeves 90 (e.g., boots) to the meter load terminals 85 of the meter 50. Next, at 645, the meter 50, with the attached disconnect sleeves 90, is connected to the bypass meter socket 15 via the meter socket extender 55. More specifically, the meter 50 is connected to the meter socket extender 55, which is connected to the bypass meter socket 15.

At 648, a meter sealing ring 60 is installed around the meter 50 to secure and seal the meter 50 within the meter socket extender 55 and the meter socket box 30. After the meter sealing ring 60 is installed, the meter sealing ring 60 is sealed, at 651, thereby sealing the meter 50 with the meter socket cover 35 of the meter socket box 30. Accordingly, foreign objects, such as water and dirt, cannot leak into the meter 50 and meter socket 15.

Next, at 654, the meter socket cover 35 is sealed with the meter socket box 30 using a meter socket cover seal 40. The meter socket cover seal 40 is adapted to secure and seal the meter socket cover 35 to the meter socket box 30, thereby preventing foreign objects (e.g., water, dirt, etc.) from entering the meter socket box 30.

Finally, at 657, the utility service person verifies the register display readings of the meter 50, if the meter 50 is an electronic meter. The utility service person then terminates operation in accordance with method 600.

If, however, at 639, the determination is made that the original meter 50 will not be left with the bypass meter socket 15, then the utility service person, at 660, installs a meter blank out cover 65 into the meter socket extender 55 that is connected to the bypass meter socket 15. One skilled in the art will recognize that the meter blank out cover 65 is generally molded of nonconductive material and is adapted to fit over the bypass meter socket 15 and/or meter socket extender 55 as the second aspect of the meter 50 would fit over the bypass meter socket 15 and/or meter socket extender 55. The meter blank out cover 65 prevents foreign objects from being inserted into the bypass meter socket 15 or meter socket extender 55.

At 663, a meter sealing ring 60 is installed around the meter blank out cover 65 to secure and seal the meter blank out cover 65 within the meter socket extender 55 and the meter socket box 30. After the meter sealing ring 60 is installed, the meter sealing ring 60 is sealed, at 666, thereby sealing the meter blank out cover 65 with the meter socket cover 35 of the meter socket box 30. Accordingly, foreign objects, such as water and dirt, cannot leak into the bypass meter socket 15.

Next, at 669, the meter socket cover 35 is sealed with the meter socket box 30 using a meter socket cover seal 40. The meter socket cover seal 40 is adapted to secure and seal the meter socket cover 35 to the meter socket box 30, thereby preventing foreign objects (e.g., water, dirt, etc.) from entering the meter socket box 30. The utility service person then terminates operation in accordance with method 600.

Numerous characteristics and advantages have been set forth in the foregoing description, together with details of structure and function. While the invention has been disclosed in several forms, it will be apparent to those skilled in the art that many modifications, additions, and deletions, especially in matters of shape, size, and arrangement of parts, may be made therein without departing from the spirit and scope of the invention and its equivalents as set forth in the following claims. Therefore, other modifications or embodiments as may be suggested by the teachings herein are particularly reserved as they fall within the breadth and scope of the claims here appended.

What is claimed is:

1. A method of disconnecting electric service using a meter socket bypass disconnect device, comprising the steps of:
   a. removing a meter socket cover to expose a meter socket containing an electric meter;
   b. measuring electric current at electric terminals within said meter socket;
   c. if measurement of said current exceeds 100 amps, discontinuing the method;

d. if measurement of said current is less than 100 amps, operably engaging a bypass handle to allow line current to bypass said meter socket;
e. removing said electric meter;
f. connecting a meter socket bypass disconnect device with a meter socket extender;
g. operating a switch on said meter socket bypass disconnect device to a load closed position and electrically connecting said meter socket bypass disconnect device and meter socket extender with said meter socket;
h. confirming load closed and proper electrical service phase status using meter socket bypass disconnect device indicators;
i. operably moving a bypass handle to allow line current to flow through said meter socket;
j. operating a switch on said meter socket bypass disconnect device to a load open position and confirming load open status using meter socket bypass disconnect device indicators;
k. again measuring electric current at electric terminals within said meter socket to verify current of zero amps;
l. replacing meter socket cover;
m. removing meter socket bypass disconnect device from meter socket extender, leaving meter socket extender in place in said meter socket;
n. installing disconnect sleeves on load terminals of said electric meter;
o. installing said electric meter in said meter socket extender;
p. installing a sealing ring on the electric meter/meter socket extender assembly, and;
q. sealing the meter within a meter cover.

2. A method of disconnecting electric service using a meter socket bypass disconnect device, the method comprising: operably moving a bypass handle to allow line current to flow through a meter socket; removing a meter socket bypass disconnect device from a meter socket extender, leaving the meter socket extender in place in the meter socket; and installing disconnect sleeves on load terminals of an electric meter; removing a cover of the meter socket to expose the meter socket containing the electric meter; measuring electric current at electric terminals within the meter socket; and if the measurement of the current exceeds 100 Amps: discontinuing the method, or if the measurement is less than 100 Amps: operably engaging the bypass handle to allow the line current to bypass the meter socket.

3. The method of claim 2, further comprising removing the electric meter.

4. The method of claim 3, further comprising connecting the meter socket bypass disconnect device to a load closed position and electrically connecting the meter socket bypass disconnect device and the meter socket extender to the meter socket.

5. The method of claim 4, further comprising confirming load closed and proper electrical service phase status using indicators from the meter socket bypass disconnect device.

6. The method of claim 5, further comprising operating a switch on the meter socket bypass disconnect device to a load open position and confirming load open status using the indicators of the meter socket bypass disconnect device.

7. The method of claim 6, further comprising measuring electric current at the electric terminals with the meter socket to verify current of zero Amps.

8. The method of claim 7, further comprising installing the electric meter in the meter socket extender.

9. The method of claim 8, further comprising installing a sealing ring on at least one of the electric meter or the meter socket extender.

10. The method of claim 9, further comprising sealing the meter within a meter cover to protect the meter.

* * * * *